United States Patent
Neti et al.

(10) Patent No.: US 10,403,116 B2
(45) Date of Patent: Sep. 3, 2019

(54) ELECTRICAL SIGNATURE ANALYSIS OF ELECTRICAL ROTATING MACHINES

(71) Applicant: General Electric Company, Schenectady, NY (US)

(72) Inventors: Prabhakar Neti, Niskayuna, NY (US); Balakrishna Pamulaparthy, Andhra Pradesh (IN); Sudhanshu Mishra, Andhra Pradesh (IN); Balamourougan Vinayagam, Markham (CA); Mitalkumar Kanabar, Markham (CA); Vijayasarathi Muthukrishnan, Markham (CA)

(73) Assignee: General Electric Company, Schenectady, NY (US)

( * ) Notice: Subject to any disclaimer, the term of this patent is extended or adjusted under 35 U.S.C. 154(b) by 61 days.

(21) Appl. No.: 15/628,004

(22) Filed: Jun. 20, 2017

(65) Prior Publication Data

US 2018/0365963 A1 Dec. 20, 2018

(51) Int. Cl.
*G08B 21/18* (2006.01)
*G01R 23/16* (2006.01)
(Continued)

(52) U.S. Cl.
CPC ........... *G08B 21/182* (2013.01); *G01R 23/16* (2013.01); *G01R 31/343* (2013.01); *H02P 29/0241* (2016.02)

(58) Field of Classification Search
CPC ....... G08B 21/182; G01R 23/16; H02P 23/14; H02P 29/0241; H02P 29/032; H02P 6/34;
(Continued)

(56) References Cited

U.S. PATENT DOCUMENTS

| 5,436,784 A | 7/1995 | Schweitzer, III et al. |
| 5,550,879 A | 8/1996 | Hershey |

(Continued)

FOREIGN PATENT DOCUMENTS

| EP | 0866485 B1 | 9/1998 |
| EP | 1 027 759 A1 | 8/2000 |

(Continued)

OTHER PUBLICATIONS

Extended European Search Report and Opinion issued in connection with corresponding EP Application No. 18176966.2 dated Aug. 8, 2018.

*Primary Examiner* — James J Yang
*Assistant Examiner* — Kevin Lau
(74) *Attorney, Agent, or Firm* — Buckley, Maschoff & Talwalkar, LLC (57) ABSTRACT

This disclosure relates to systems and methods for electrical signature analysis of electrical rotating machines. In one embodiment of the disclosure, a method includes ascertaining initial information associated with an electrical rotating machine, assigning a plurality of operational conditions associated with the machine to a plurality of buckets, and recording the electrical data to obtain a pre-defined number of sets of learning data. The method further includes determining, based at least on the initial information and the learning data, that the machine is in a healthy condition, obtaining, based on the learning data, baseline data associated with at the at least one bucket, and generating, based on the baseline data, a threshold associated with the bucket and at least one fault frequency associated with the machine. The method further includes generating, based on the threshold and the baseline data, alarms concerning a state of the electrical rotating machine.

16 Claims, 6 Drawing Sheets

(51) Int. Cl.
*G01R 31/34* (2006.01)
*H02P 29/024* (2016.01)

(58) Field of Classification Search
CPC .......... H02P 29/00; H02P 29/024; H02P 6/06; H02P 8/34; G05B 23/0283; G05B 2223/06; G05B 13/026; G06F 11/008
See application file for complete search history.

(56) References Cited

U.S. PATENT DOCUMENTS

| | | | |
|---|---|---|---|
| 5,550,880 A | 8/1996 | Abdel-Malek et al. | |
| 5,629,870 A | 5/1997 | Farag et al. | |
| 5,640,103 A | 6/1997 | Petsche et al. | |
| 5,675,497 A | 10/1997 | Petsche et al. | |
| 6,181,042 B1 | 1/2001 | Grant et al. | |
| 6,199,023 B1 | 3/2001 | Kliman | |
| 6,262,550 B1 | 7/2001 | Kliman et al. | |
| 6,496,782 B1 | 12/2002 | Claus et al. | |
| 6,573,727 B2 | 6/2003 | Krahn et al. | |
| 6,611,771 B1 | 8/2003 | Habetler et al. | |
| 6,655,835 B2 | 12/2003 | Mattoon et al. | |
| 6,834,256 B2 | 12/2004 | House et al. | |
| 6,839,597 B2 | 1/2005 | Hattori et al. | |
| 6,888,124 B1 | 5/2005 | Smith | |
| 6,924,613 B2 | 8/2005 | Jonsson | |
| 6,946,967 B2 | 9/2005 | Klaus et al. | |
| 7,127,373 B2 | 10/2006 | House et al. | |
| 7,161,778 B2 | 1/2007 | Zocholl | |
| 7,231,319 B2 | 6/2007 | Dimino et al. | |
| 7,254,514 B2 | 8/2007 | House et al. | |
| 7,269,569 B2 | 9/2007 | Spira et al. | |
| 7,283,914 B2 | 10/2007 | Poorman et al. | |
| 7,308,383 B2 | 12/2007 | Zuzuly et al. | |
| 7,346,475 B2 | 3/2008 | Dimino et al. | |
| 7,352,141 B2 | 4/2008 | Kling et al. | |
| 7,362,550 B2 | 4/2008 | Groening et al. | |
| 7,385,365 B2 | 6/2008 | Feick | |
| 7,755,310 B2 | 7/2010 | West et al. | |
| 7,777,516 B2 | 8/2010 | Zhou et al. | |
| 7,831,704 B2 | 11/2010 | Schachtely et al. | |
| 7,847,580 B2 | 12/2010 | Zhou et al. | |
| 7,956,637 B2 | 6/2011 | Lu et al. | |
| 8,010,318 B2 | 8/2011 | Lu et al. | |
| 8,054,084 B2 | 11/2011 | Schulz et al. | |
| 8,131,658 B2 | 3/2012 | McKinstry et al. | |
| 8,229,682 B2 | 7/2012 | El-Refaie et al. | |
| 8,269,448 B2 | 9/2012 | Beifus et al. | |
| 8,332,163 B2 | 12/2012 | Turner et al. | |
| 8,339,084 B2 | 12/2012 | Welchko | |
| 8,378,605 B2 | 2/2013 | Wang et al. | |
| 8,401,822 B2 * | 3/2013 | Dimino | G01R 31/343 |
| | | | 324/765.01 |
| 8,405,339 B2 | 3/2013 | Zhang et al. | |
| 8,558,496 B2 | 10/2013 | Welchko et al. | |
| 8,676,356 B2 | 3/2014 | Lu et al. | |
| 8,716,971 B2 | 5/2014 | Lopez-Diaz et al. | |
| 2005/0007096 A1* | 1/2005 | Dimino | G05B 23/0229 |
| | | | 324/142 |
| 2005/0033557 A1 | 2/2005 | House et al. | |
| 2006/0259271 A1 | 11/2006 | House et al. | |
| 2007/0055722 A1 | 3/2007 | Lonn | |
| 2009/0096405 A1 | 4/2009 | Flickinger et al. | |
| 2011/0025371 A1 | 2/2011 | Simon | |
| 2012/0035885 A1* | 2/2012 | Tarassenko | G01H 1/006 |
| | | | 702/183 |
| 2013/0049733 A1 | 2/2013 | Neti et al. | |
| 2013/0088799 A1 | 4/2013 | Zeller | |
| 2013/0107400 A1 | 5/2013 | Meng et al. | |
| 2013/0314014 A1 | 11/2013 | Tremel et al. | |
| 2013/0314822 A1 | 11/2013 | Dio | |
| 2014/0063661 A1 | 3/2014 | D'Aversa et al. | |
| 2014/0084937 A1 | 3/2014 | Neti et al. | |
| 2014/0172326 A1 | 6/2014 | Zhang et al. | |
| 2014/0303913 A1 | 10/2014 | Neti et al. | |
| 2017/0146360 A1* | 5/2017 | Averbuch | G01C 21/3679 |
| 2017/0181085 A1* | 6/2017 | Crawford | H04W 52/0229 |

FOREIGN PATENT DOCUMENTS

| | | |
|---|---|---|
| EP | 1166428 B1 | 12/2004 |
| EP | 0909380 B1 | 2/2005 |
| EP | 1064716 B1 | 8/2005 |
| EP | 1468302 B1 | 8/2005 |
| EP | 2051086 A2 | 4/2009 |
| EP | 2288000 A2 | 2/2011 |
| EP | 2523009 A1 | 11/2012 |
| EP | 2568583 A1 | 3/2013 |
| EP | 2574947 A1 | 4/2013 |
| EP | 2698615 A1 | 2/2014 |
| EP | 2725370 A1 | 4/2014 |
| EP | 2 743 669 A1 | 6/2014 |
| WO | 1995/007451 A1 | 3/1995 |
| WO | 2008/113308 A1 | 9/2008 |
| WO | 2008/116966 A2 | 10/2008 |
| WO | 2008/148075 A1 | 12/2008 |
| WO | 2009/071064 A1 | 6/2009 |
| WO | 2013/006742 A1 | 1/2010 |
| WO | 2011/006528 A1 | 1/2011 |
| WO | 2011/124963 A1 | 10/2011 |
| WO | 2013/123947 A1 | 8/2013 |
| WO | 2013/176708 A1 | 11/2013 |
| WO | 2017/081908 A1 | 5/2017 |

* cited by examiner

ELECTRICAL SIGNATURE ANALYSIS OF ELECTRICAL ROTATING MACHINES

TECHNICAL FIELD

The disclosure relates to monitoring electrical equipment, and, more specifically, to systems and methods for performing electrical signature analysis of electrical rotating machines.

BACKGROUND

Monitoring of components of industrial power systems, such as electrical plants and substations, is important for continuous operation of the industrial power systems. The components, such as transformers, motors, feeders, generators, circuit breakers, and so forth, are expected to run constantly for long periods of time. The monitoring may allow detecting events related to operation of the components and predict issues associated with health or condition of the components. When an issue is detected, a diagnosis and a root cause can be reported to a user so the user can take measures minimizing or resolving the issue. Monitoring of important components of industrial power systems may provide insight into components' health in order to improve reliability and efficiency of the components, increase production capacity of the components, and avoid unexpected costs in their maintenance.

Conventional solutions for monitoring and diagnostics of electrical power system components are very complex and are typically designed for specific components so that they cannot be easily adjusted to components of different types and sizes. For example, conventional solutions cannot be adjusted for use as part of intelligent electronic devices (IEDs), such as digital protection relays. Furthermore, costs associated with the conventional monitoring solutions do not typically correspond to costs of components being monitored. Additionally, conventional monitoring and diagnostics solutions typically cannot provide reliable predictions with regard to health of components as they are using limited information and data available to IEDs. Moreover, existing solutions for monitoring and diagnostics can be prone to measurement and accuracy related errors. Monitoring and diagnostics solutions used for providing analytics concerning a health state of components of industrial power systems are typically based on limited data.

SUMMARY OF THE DISCLOSURE

This disclosure relates to systems and methods for electrical signature analysis of electrical rotating machines. Certain embodiments of the disclosure can provide automatic procedures for collecting and systematically analyzing operational data of electrical rotating machines. Some embodiments of the disclosure may facilitate early detection of mechanical failures of electrical rotating machines.

According to one embodiment of the disclosure, a system for electrical signature analysis of electrical rotating machines is provided. The system may include an electrical rotating machine. The system may further include a data acquisition device configured to detect and provide at least electrical data associated with the electrical rotating machine. The system may further include an equipment controller communicatively coupled to the data acquisition device. The equipment controller can be configured, in a learning mode, to ascertain initial information associated with an electrical rotating machine. The equipment controller can be configured to assign a plurality of operational conditions associated with the electrical rotating machine to a plurality of buckets. A bucket of the plurality of buckets can be associated with at least one load window selected from a plurality of load windows. The equipment controller can be configured to record the electrical data to obtain a pre-defined number of sets of learning data. The equipment controller can be configured to determine, based at least on the initial information and the learning data that the electrical rotating machine is in a healthy condition. Based on a determination that the electrical rotating machine is in the healthy condition, the equipment controller can be configured to obtain, based on the learning data, baseline data associated with the bucket. The equipment controller can be configured to generate, based on the baseline data, a threshold associated with the bucket and at least one fault frequency associated with the electrical rotating machine. The equipment controller can be configured to generate, based on the threshold and the baseline data, at least one alarm concerning a state of the electrical rotating machine running within operational conditions associated with the bucket.

In some embodiments of the disclosure, the equipment controller can be further configured, in a monitoring mode, to continue recording the electrical data to obtain incoming data. The equipment controller can be further configured to determine a current bucket associated with the incoming data. The equipment controller can be further configured to determine that the baseline data and the threshold are present for the current bucket. Based on a determination that the baseline data and the threshold are present, the equipment controller can be further configured to determine that incoming data exceed the baseline data by more than the threshold for the at least one fault frequency. Based on a determination that the incoming data exceed the baseline data by more than the threshold for the at least one fault frequency, the equipment controller can be further configured to issue an alarm concerning at least one event of the electrical rotating machine.

In some embodiments of the disclosure, the equipment controller can be further configured to obtain, based on the learning data, static data including at least vibration data and temperature signal. The equipment controller may further configured to determine that the static data are within a pre-defined range. Based on a determination that the static data are within a pre-defined range, the equipment controller can be further configured to conclude that the electrical rotating machine is in healthy condition. Based on a determination that the static data are not within a pre-defined range, the equipment controller can be further configured to issue a recommendation regarding an inspection of the electrical rotating machine.

In some embodiments of the disclosure, the equipment controller can be further configured to compute load conditions for the pre-defined number of sets of learning data. The equipment controller can be further configured to determine, based on the load conditions, a bucket containing most frequently occurring load conditions. The equipment controller can be further configured to evaluate, based on the learning data within the bucket, operational data of the electrical rotating machine, the operational data including one of a speed, a torque, or an efficiency. The equipment controller can be further configured to determine that the operational data are within a pre-defined range. Based on a determination that the operational data are not within the pre-defined range, the equipment controller can be further configured to issue a recommendation regarding an inspection of the electrical rotating machine.

In some embodiments of the disclosure, the equipment controller can be further configured to compute variations for sets of the learning data. The equipment controller can be further configured to select a set with variation less than a pre-determined value. The equipment controller can be further configured to assign the learning data of the selected set as baseline data. The equipment controller can be further configured to convert the baseline data and the learning data associated with the bucket from a time domain to a frequency domain. The equipment controller can be further configured to determine, based on the baseline data, a first frequency signature for the at least one fault frequency. The equipment controller can be further configured to determine, based on the learning data associated with the bucket, a second frequency signature for the at least one fault frequency. The equipment controller can be further configured to determine that the second frequency signature is higher than the first frequency signature by a pre-determined value. Based on a determination that the second frequency signature is not higher than the first frequency signature by the pre-determined value, the equipment controller can be further configured to conclude that the electrical rotating machine is in the healthy conditions Based on a determination that the second frequency signature is higher than the first frequency signature by the pre-determined value, the equipment controller can be further configured to issue a recommendation concerning an inspection of the electrical rotating machine.

In some embodiments of the disclosure, the equipment controller can be further configured to compute variations for the sets of the learning data associated with the at least one bucket. The equipment controller can be further configured to select a set with the smallest variation. The equipment controller can be further configured to assign the selected set as the baseline data.

In certain embodiments of the disclosure, the equipment controller can be further configured to compute variations for the sets of the learning data associated with the at least one bucket. The equipment controller can be further configured to select sets with variation less than a pre-determined value. The equipment controller can be further configured to convert the learning data associated with the selected sets from a time domain to a frequency domain to obtain sets of frequency data. The equipment controller can be further configured to average the sets of frequency data to obtain the baseline data. The equipment controller can be further configured to compute a standard deviation of the frequency data for at least one fault frequency. The equipment controller can be further configured to determine, based on the standard deviation, the threshold associated with the at least one fault frequency and the at least one bucket.

In some embodiments of the disclosure, the equipment controller can be further configured to compute the threshold by multiplying a standard deviation by a predetermined constant value, the predetermined constant value being selected based on an expected false positive error.

In some embodiments of the disclosure, after generating the threshold, the equipment controller is further configured to determine a noise floor based on the baseline data. The equipment controller can be further configured to adjust the threshold based on the noise floor.

In some embodiments of the disclosure, the initial information includes at least one of name plate details, maintenance intervals, a maintenance history, a previous fault history, operational environment details, and a description of load conditions.

According to one embodiment of the disclosure, a method for electrical signature analysis of an electrical rotating machine is provided. An example method may include providing, by a data acquisition device communicatively coupled to an electrical rotating machine, at least electrical data associated with the electrical rotating machine. The method may include ascertaining, by an equipment controller communicatively coupled to the data acquisition device, initial information associated with the electrical rotating machine. The method may include assigning, by an equipment controller, a plurality of operational conditions associated with the electrical rotating machine to a plurality of buckets. A bucket of the plurality of buckets can be associated with at least one load window selected from a plurality of load windows. The method may include recording, by the equipment controller, the electrical data to obtain a pre-defined number of sets of learning data.

The method may include determining, by the equipment controller, based at least on the initial information and the learning data that the electrical rotating machine is in a healthy condition. Based on a determination that the electrical rotating machine is in the healthy condition, the method may include obtaining, by the equipment controller and based on the learning data, baseline data associated with at least one bucket. The method may include generating, by the equipment controller and based on the baseline data, a threshold associated with the at least one bucket and the at least one fault frequency associated with the electrical rotating machine. The method may further include generating, based on the threshold and the baseline data, an alarm concerning a state of the electrical rotating machine running within operational conditions associated with the at least one bucket.

Other embodiments, systems, methods, features, and aspects will become apparent from the following description taken in conjunction with the following drawings.

DETAILED DESCRIPTION

The following detailed description includes references to the accompanying drawings, which form part of the detailed description. The drawings depict illustrations, in accordance with example embodiments. These example embodiments, which are also referred to herein as "examples," are described in enough detail to enable those skilled in the art to practice the present subject matter. The example embodiments may be combined, other embodiments may be utilized, or structural, logical, and electrical changes may be made, without departing from the scope of the claimed subject matter. The following detailed description is, therefore, not to be taken in a limiting sense, and the scope is defined by the appended claims and their equivalents.

Certain embodiments of the disclosure can include systems and methods for electrical signature analysis of electrical equipment, such as electrical rotating machines. The disclosed systems and methods may provide an automatic procedure for collecting and analyzing operational data of electrical rotating machines. Some embodiments of the disclosure may facilitate predicting of mechanical failures associated with the electrical rotating machine and minimizing false positive detection of the mechanical failures. While some embodiments of the disclosure are described in reference to operations of electrical rotating machines, a similar technology can be practiced with other industrial electrical equipment including, but not limited to, air cooled heat exchangers, blowers, compressors, cooling towers, heat exchangers, and so forth.

In some example embodiments of the disclosure, a method for electrical signature analysis may include providing, by a data acquisition device communicatively coupled to an electrical rotating machine, at least electrical data associated with the electrical rotating machine. The method may further include ascertaining, by an equipment controller communicatively coupled to the data acquisition device, initial information associated with the electrical rotating machine. The method may include assigning, by an equipment controller, one or more operational conditions associated with the electrical rotating machine to one or more buckets. A bucket of the one or more buckets can be associated with at least one load window selected from one or more load windows. The method may further include recording, by the equipment controller, the electrical data to obtain a pre-defined number of sets of learning data. The method may further include determining, by the equipment controller, based at least on the initial information and the learning data that the electrical rotating machine is in a healthy condition. Based on a determination that the electrical rotating machine is in the healthy condition, the method may obtain, by the equipment controller and based on the learning data, baseline data associated with at least one bucket.

The method may include generating, by the equipment controller and based on the baseline data, a threshold associated with the at least one bucket and the at least one fault frequency associated with the electrical rotating machine. The method may include generating, based on the threshold and the baseline data, an alarm concerning a state of the electrical rotating machine running within operational conditions associated with the at least one bucket. In certain embodiments, the method may include facilitating implementation, based on the threshold and the baseline data, of at least one corrective action to operating the electrical rotating machine.

Technical effects of certain embodiments of the disclosure may include eliminating a manual process of monitoring and diagnostics of electrical equipment. Further technical effects of certain embodiments of the disclosure may provide online insight into one or more components of electrical equipment to improve reliability of the components and reduce maintenance costs. Further technical effects of certain embodiments of the disclosure may allow adjusting a method of monitoring and diagnostics to equipment of different types, sizes, power capacities, and customer requirements on prediction of failures associated with the equipment. Yet further technical effects of certain embodiments of the disclosure may allow a reduction in unplanned shutdowns, forced outage time, and unplanned expenses.

The following provides a detailed description of various example embodiments related to systems and methods of performing automatic procedure for monitoring and diagnostics of machine.

Figure 1:
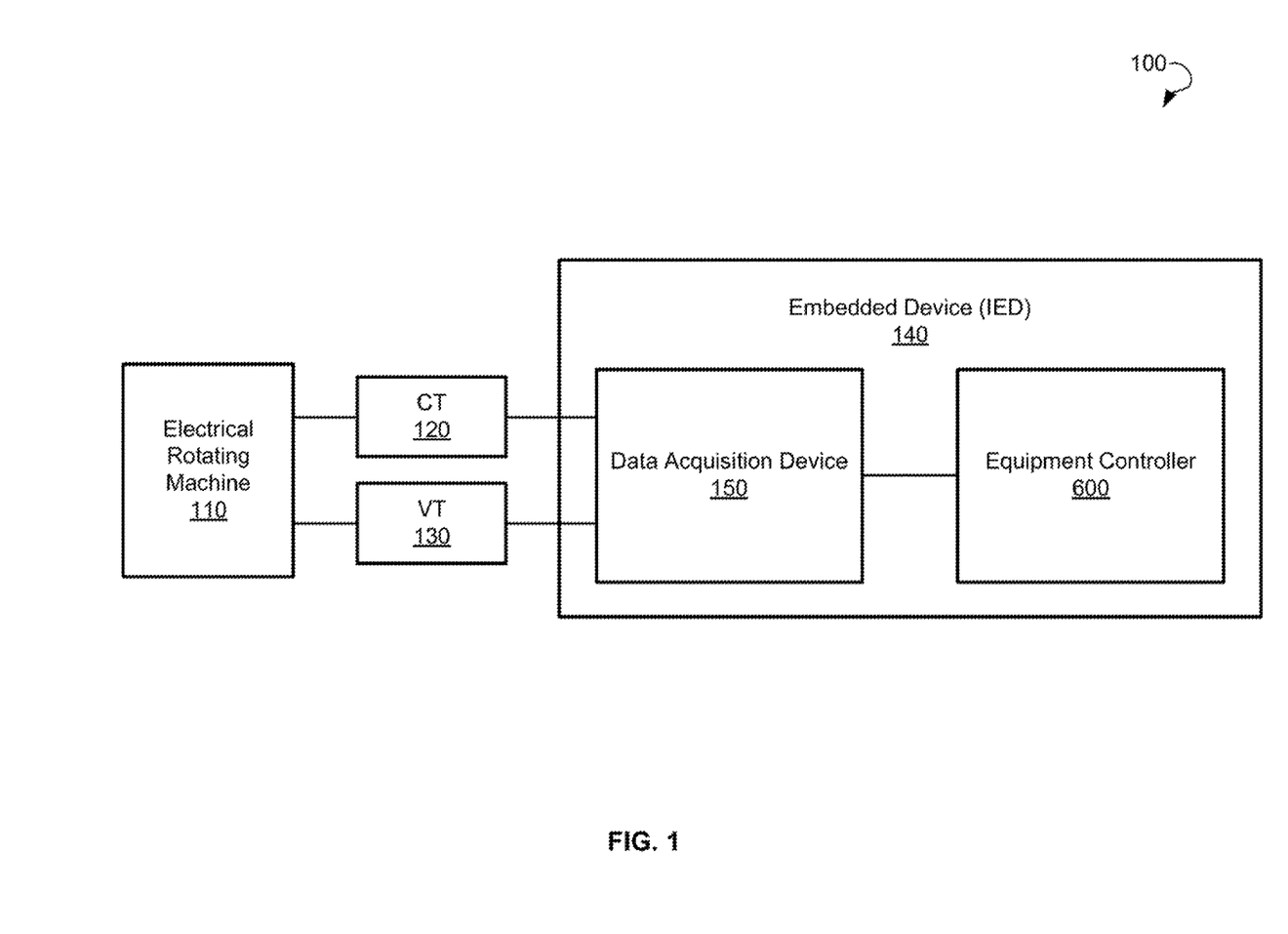
FIG. 1 is a block diagram illustrating an example system in which certain methods for electrical signature analysis of an electrical rotating machine can be implemented, according to some embodiments of the disclosure.

Turning now to the drawings, FIG. 1 is a block diagram illustrating a system 100, in accordance with an example embodiment of the disclosure. The system 100 may include an electrical rotating machine 110, an electrical current transformer (CT) 120, a voltage transformer (VT) 130, and an embedded device 140 (also referred as an IED 140).

In various embodiments of the disclosure, the electrical rotating machine 110 may include an electrical generator or an electrical motor. The electrical rotating machine 110 may include rolling element bearings. The rolling element bearings may support load and maintain clearance between stationary elements of the machine and rotating elements of the machine. The rolling element bearings can be associated with fundamental fault frequencies, which are a function of a geometry of rolling element bearings.

In some embodiments of the disclosure, the CT 120 and VT 130 may be configured to receive high voltage electrical current of electrical rotating machine 110 and convert the high voltage electrical current to a low voltage electrical current. In some embodiments of the disclosure, the embedded device 140 may include a data acquisition device 150 and an equipment controller 600. In an example embodiment of the disclosure, the equipment controller 600 is shown to as part of system 100; in other embodiments of the disclosure, the equipment controller 600 may be located remotely from the system 100.

In various embodiments of the disclosure, the data acquisition device 150 may be configured to receive and digitize at least electrical data associated with electrical rotating machine 110. The electrical data may include electrical current data of three phases of electrical signals and voltage data of three phases of the electrical signal. In some embodiments, the data acquisition device 150 may receive the electrical current data and the voltage data via CT 120 and VT 130. In further embodiments of the disclosure, the data acquisition device 150 may be further configured to receive and digitize thermal data and electromechanical data associated with the electrical rotating machine 110. In certain embodiments of the disclosure, the data acquisition device 150 may be further configured to receive and digitize speed data and vibrational data associated with the electrical rotating machine 110.

In various embodiments of the disclosure, equipment controller 600 may be configured to receive, via the data acquisition device 150, and analyze operational data associated with the electrical rotating machine 110. The operational data may include, but not limited to, the electrical data, thermal data, and electromechanical data. In some embodiments of the disclosure, the equipment controller 600 may be configured to identify, based at least on the electrical data, one or more mechanical failure modes of the electrical rotation machine 110, such as, but not limited to, bearing faults, loose foundations, eccentricity of a rotating shaft, and misalignment of the rotating shaft. In certain embodiments, the equipment controller 600 may be configured to provide, based on an identified failure mode, alerts concerning the failure mode. In some embodiments of the disclosure, the equipment controller 600 may be also configured to generate commands (opening or closing) for protection relays and circuits breakers.

In various embodiments of the disclosure, the equipment controller 600 can be configured to analyze operational data of the electrical rotating machine in either a learning mode or a monitoring mode. In some embodiments of the disclosure, a set of operational conditions associated with electrical rotating machine 110 can be divided into a plurality of buckets of operational conditions. In certain embodiments, each bucket can be associated with at least one load window selected from a plurality of load windows. In certain embodiments of the disclosure, the plurality of load windows may include following load intervals: 0%-10%, 10%-20%, 20%-30%, 30%-40%, 40%-50%, 50%-60%, 60%-70%, 70%-80%, 80%-90%, 90%-100%, 100%-110%, and 110%-120%.

In various embodiments of the disclosure, operational data can be associated with specific operational conditions which may belong to at least one bucket of operational conditions. In a learning mode, the equipment controller 600 can be configured to collect learning data for the buckets. When a pre-determined number of sets of the learning data is collected for a specific bucket, the equipment controller can be further configured to obtain, based on the learning data for the specific bucket, baseline data and one or more threshold associated with the specific bucket. Thus, the specific bucket may be associated with the baseline data and one or more thresholds which are specific to the operational conditions associated with the specific bucket. The baseline data and threshold can be further utilized in a monitoring mode.

In the monitoring mode, the equipment controller 600 may receive incoming operational data associated with the electrical rotating machine 110 and determine operational conditions associated with the incoming data. The equipment controller 600 may be further configured to determine a current bucket associated with operational conditions of the incoming data. If baseline data and a threshold are already present for the current bucket, the incoming data can be compared to the baseline data. The equipment controller 600 can be configured to issue an alarm concerning a state of the electrical rotating machine 110 if a difference between the incoming data and the baseline data is larger the threshold.

If the baseline data and the threshold are not available for the current bucket, then the incoming data can be recorded as learning data associated with the current bucket, so that the incoming data can be further used to determine the baseline data and thresholds for the current bucket. The equipment controller 600 can be further configured to switch to the learning mode. Thus, depending on whether baseline data and threshold are present for a certain bucket, the equipment controller 600 may be configured to run in either a monitoring mode or a learning mode for the current bucket. Some buckets of operational conditions may never be assigned baseline data and thresholds if the electrical rotating machine 110 is not run under operational conditions associated with such buckets. If the electrical rotating machine 110 enters operational conditions associated with a new bucket, for which baseline data and thresholds are not present, the equipment controller can be configured to switch to the learning mode and collect learning data for the new bucket.

In various embodiments, the thresholds can be selected to minimize false positive detection of mechanical failures. The thresholds associated with a certain bucket can be determined at least partially based on customer requirements. Customer requirements may include conservative, moderate, or aggressive requirements. The conservative requirements can correspond to high level thresholds which may not allow any false alarms concerning a state of the electrical rotating machine 110. Aggressive requirements may correspond to low level thresholds which may allow a certain number of false alarms. Moderate requirements may correspond to thresholds between high level thresholds and low level thresholds.

Figure 2:
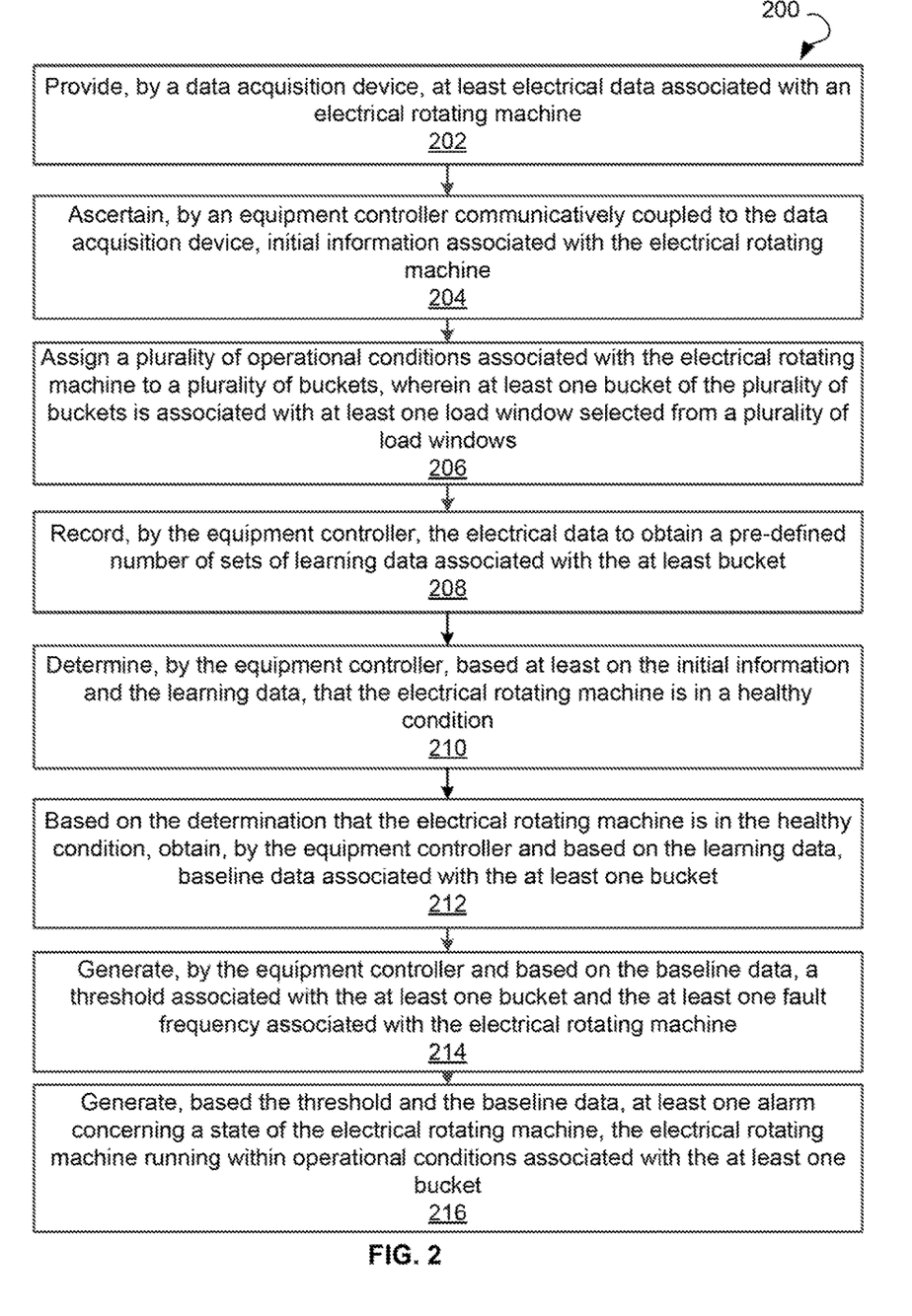
FIG. 2 is a flow chart of an example method for electrical signature analysis of an electrical rotating machine, according to an embodiment of the disclosure.

FIG. 2 is a flow chart of example method 200 of electrical signature analysis of an electrical rotating machine, according to some embodiments of the disclosure. The method 200 may be implemented, for example, by system 100 described above with reference to FIG. 1.

In block 202, the method 200 may commence with providing, by the data acquisition device 150, at least electrical data associated with electrical rotating machine 110.

In block 204, the method 200 may include ascertaining, by the equipment controller 600 communicatively coupled to the data acquisition device 150, initial information associated with the electrical rotating machine 110. The initial information may include name plate details, a maintenance interval and a previous maintenance history, and a previous fault history. The name plate details may include a voltage, a speed, a number of phases, a class of insulation, bearing numbers, a name of manufacturer, and so forth. The maintenance history may include information concerning modes of past use of the electrical rotating machine, types of issues the electrical rotating machine experienced, a lubricant change, a rotor balancing, a roundness of rotor, and so forth. The previous fault history may include information concerning bearing fails, rotor misalignments, vibrations, and so forth. The initial information may further include details concerning load conditions, including, but not limited to, duty cycle, load type (for example, intermittent loading, continuous loading, constant loading, and dynamic loading, one shift, two shift, and so forth) and operating environment. The operating environment may include information as to whether the electrical rotating machine operates indoor or outdoor, humidity, dust conditions, chemical contamination, and so forth. The initial information may further include any customer's records concerning health of the electrical rotating machine 110.

In block 206, the method 200 may include assigning one or more operational conditions associated with the electrical rotating machine 110 to one or more buckets. A bucket of the one or more buckets is associated with at least one load window selected from one or more load windows.

In block 208, the method 200 may include recording, by the equipment controller 600, the electrical data to obtain a pre-defined number of sets of learning data associated with the at least one bucket. The learning data may include dynamic data for voltage and current of electrical rotating machine 110 for at least a pre-determined number of times (for example, 50) times. In some embodiments, dynamic data may be collected every day during a learning period. The learning data may further include static data derived from the dynamic data. The static data may include vibration data and temperature data.

In block 210, the method 200 may proceed with determining, by the equipment controller 600, based at least on the initial information and the learning data that the electrical rotating machine 110 is in a healthy condition. In some embodiments of the disclosure, determining that the machine is in healthy condition can be based on static measurements of trends, such as vibrational data and temperature data associated with the electrical rotating machine 110. If any of the static measurements are determined to be out of a pre-determined range by a certain amount (for example, about 5%), then the condition of the electrical rotating machine 110 may not be healthy and the equipment controller may be configured to issue a recommendation for conducting an offline inspection of the electrical rotating machine to determine a state of the electrical rotating machine. If the static measurements are determined to be within pre-determined range, it may indicate that the electrical rotating machine is in the healthy condition.

If the electrical rotating machine 110 is in the healthy condition, then in block 212, the method 200 may include, obtaining, by the equipment controller 600 and based on the learning data, baseline data associated with at least one bucket.

In block 214, the method 200 may proceed with generating, by the equipment controller 600 and based on the baseline data, a threshold associated with at least one bucket and at least one fault frequency associated with the electrical rotating machine.

In block 216, the method 200 may proceed with generating, based on the threshold and the baseline data, at least one alarm concerning a state of the electrical rotating machine running within operational conditions associated with the at least one bucket.

In certain embodiments, the method 200 may include facilitating implementation, based on the threshold and the baseline data, of at least one corrective action to operating the electrical rotating machine.

Figure 3:
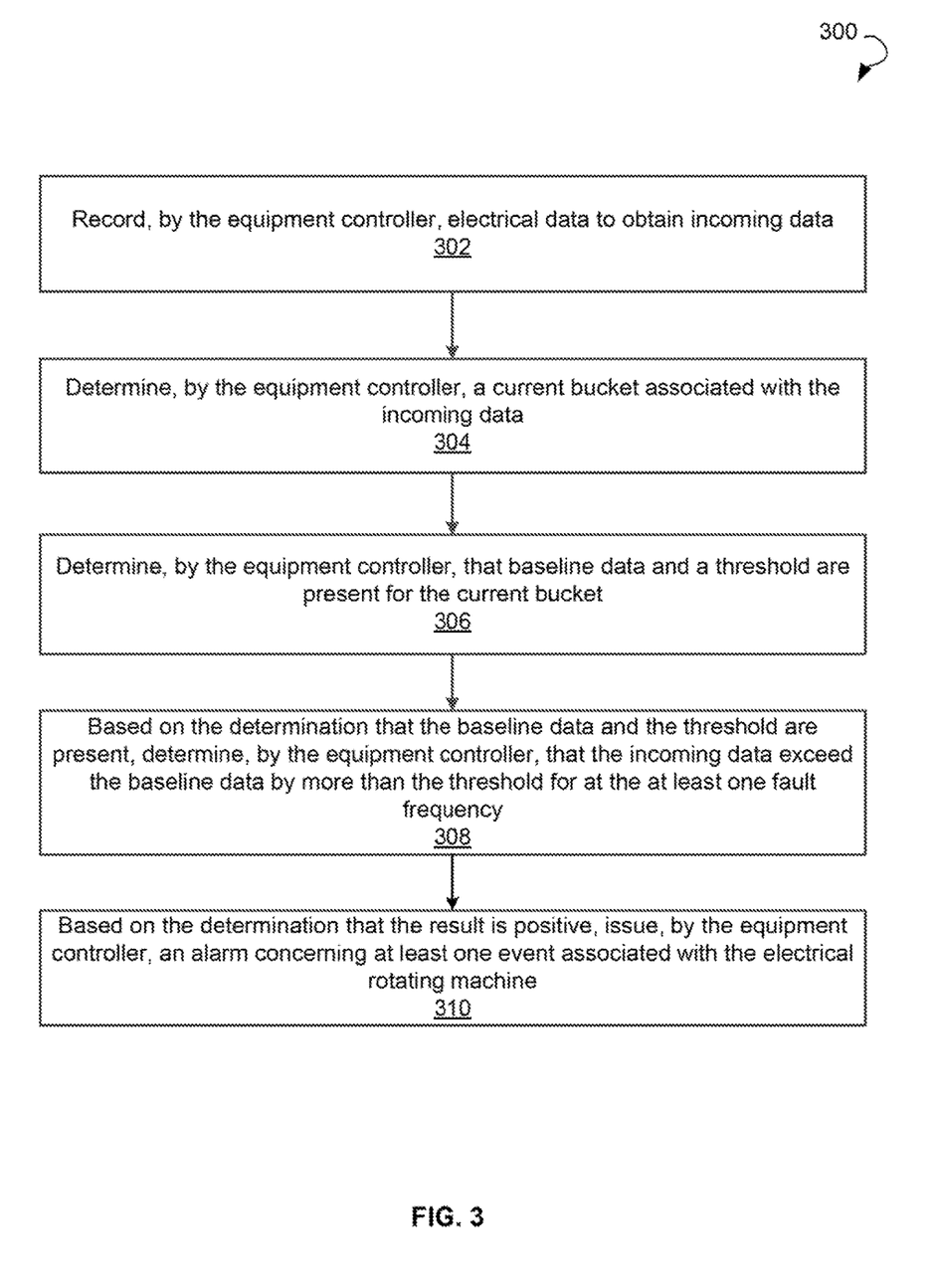
FIG. 3 is a flow chart of another example method for electrical signature analysis of an electrical rotating machine, according to some embodiments of the disclosure.

FIG. 3 is a flow chart illustrating an example method 300 of electrical signature analysis of an electrical rotating machine, according to some embodiments of the disclosure. The method 300 may provide additional details for block 216 of method 200 described above with reference to FIG. 2.

In block 302, the method 300 may commence with recording, by the equipment controller 600, electrical data to obtain incoming data associated with the electrical rotating machine 110.

In block 304, the method 300 may proceed with determining, by the equipment controller 600, a current bucket of operational conditions associated with the incoming data.

In block 306, the method 300 may include determining, by the equipment controller 600, that baseline data and a threshold are present for the current bucket. If the baseline data and threshold are not present for the current bucket, then the incoming data are recorded as learning data associated with the current bucket.

Based on the determination that the baseline data and the threshold are present, the method 300 may proceed, in block 308, with determining, by the equipment controller 600, that the incoming data exceed the baseline data by more than the threshold at the at least one fault frequency associated with the electrical rotating machine 110.

Based on the determination that the result is positive, the method 300, may proceed, in block 310, with issuing, by the equipment controller 600, an alarm concerning at least one event associated with the electrical rotating machine.

In certain embodiments, the method 300 may include facilitating implementation, based on the threshold and the baseline data, of at least one corrective action to operating the electrical rotating machine.

Figure 4:
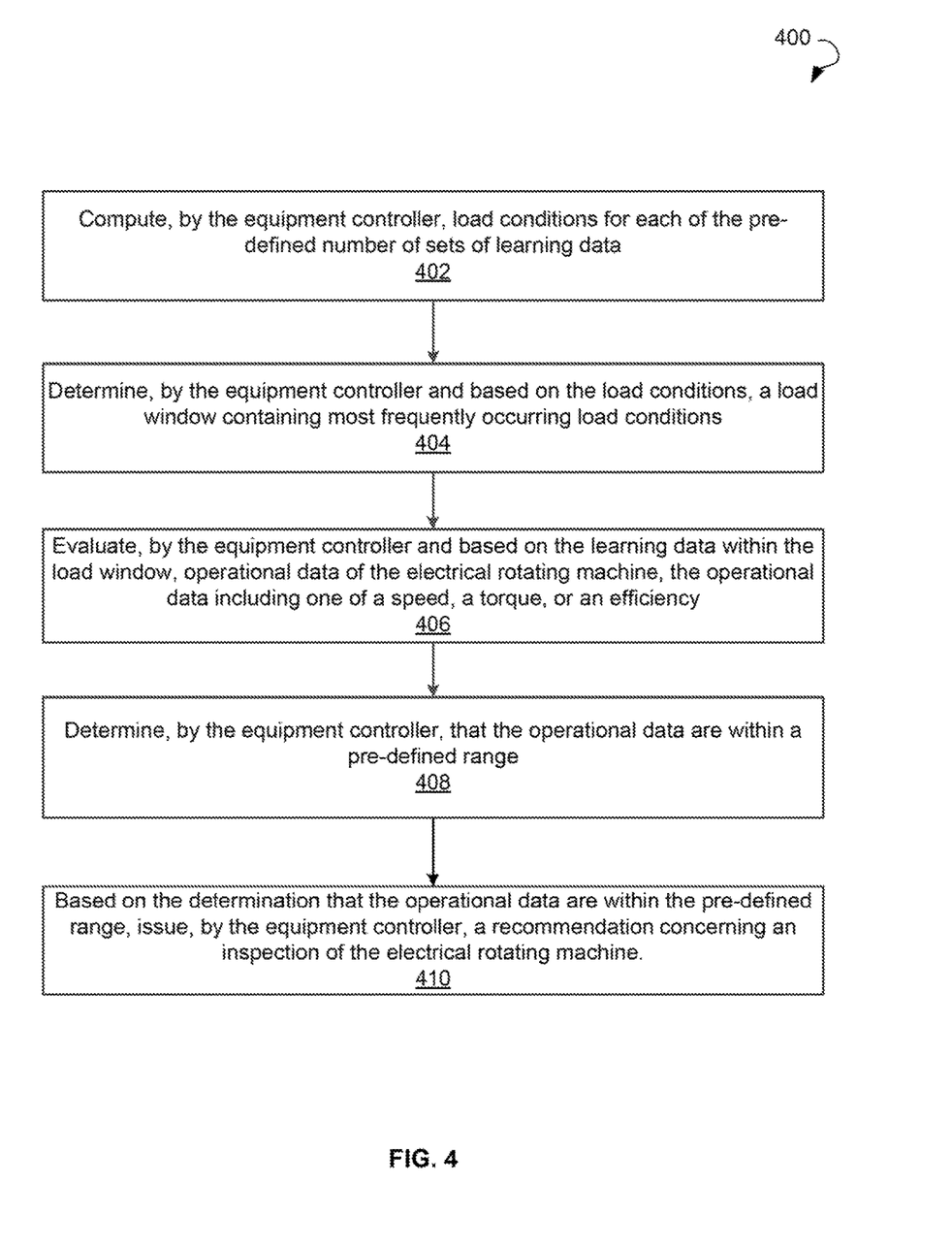
FIG. 4 is a flow chart of an example method for determining conditions of an electrical rotating machine, according to some embodiments of the disclosure.

FIG. 4 is a flow chart illustrating an example method 400 for determining conditions of an electrical rotating machine. The method 400 may provide additional details for block 210 of the method 200 described in FIG. 2.

The method 400 may commence, in block 402, with computing, by the equipment controller 600, load conditions for each of the pre-defined number of sets of learning data. The learning data may include dynamic data of current and voltage of electrical rotating machine 110. In some embodiments of the disclosure, prior to computing the load conditions, method 400 may compute, based on dynamic data, variation of a phase current for each of the pre-defined number of sets of learning data. The load conditions can be computed only for those sets of learning data which include stable dynamic data. The dynamic data can be considered stable if the variation of the phase current is within a pre-determined interval (for example, about 5%).

In block 404, the method 400 may proceed with determining, by the equipment controller 600 and based on the load conditions, a load window containing most frequently occurring load conditions.

In block 406, the method 400 may include evaluating, by the equipment controller 600 and based on the learning data within the load window containing most frequently occurring load conditions (most popular load window), operational data of the electrical rotating machine. The operational data may include a speed, a torque, or an efficiency.

In block 408, the method 400 may include determining, by the equipment controller 600, that the operational data are within a pre-defined range. If operational data are within the pre-defined range, it may indicate that the electrical rotating machine is in the healthy condition.

Based on the determination that the operational data are within the pre-defined range, the method 400 may include, in block 410, issuing, by the equipment controller, a recommendation concerning an inspection of the electrical rotating machine. For example, the recommendation can be issued if operational data (speed or efficiency) are out of the pre-determined range by more than about 5%.

In some embodiments of the disclosure, the method 400 may further include performing fast Fourier transform (FFT) analysis using the dynamic data. In certain embodiments of the disclosure, a first set of learning data with a stable dynamic data can be used as a baseline file for FFT. The method 400 may include obtaining, by the equipment controller 600, a fault signature at each fault indicating frequency associated with the electrical rotating machine 110. The method 400 may further include determining, by the equipment controller 600, that the fault signature for the at least one fault indicating frequency increases by a pre-determined amount (for example, about 5%) within the most popular load window. Based on the determination of the increase, the method 400 may include issuing, by the equipment controller 600, a recommendation to perform an offline inspection to determine a status of the electrical rotating machine 110.

In certain embodiments, the method 400 may include facilitating implementation, based on the threshold and the baseline data, of at least one corrective action to operating the electrical rotating machine.

Figure 5:
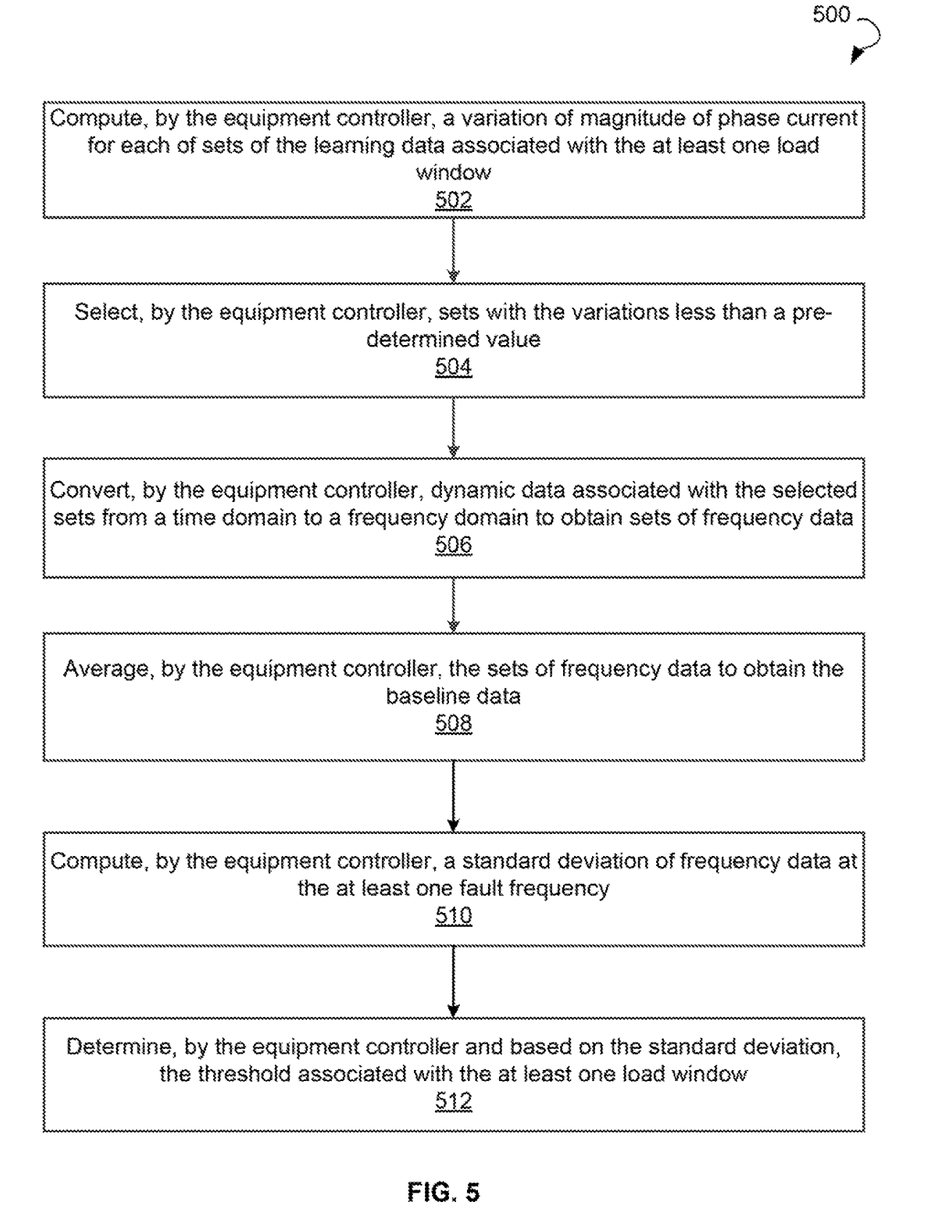
FIG. 5 is a flow chart of an example method for determining baseline data and a threshold for monitoring an electrical rotating machine, according to some embodiments of the disclosure.

FIG. 5 is a flow chart illustrating an example method 500 for determining baseline data and a threshold for an electrical rotating machine. The method 500 may provide additional details for blocks 212 and 214 of the method 200 described in FIG. 2.

The method 500 may commence, in block 502, with computing, by the equipment controller 600, a variation of magnitude of phase current for each of sets of the learning data associated with at least one bucket of operational conditions. The bucket can be associated with at least one load window.

In block 504, the method 500 may include selecting, by the equipment controller 600, sets having fewer variations than a pre-determined value (for example, less than about 5%). In some embodiments, if the number of the selected sets is less than a pre-determined number (for example, 5), it can be determined that there is not enough learning data for this bucket of operational condition and the baseline data cannot be established for the bucket.

In block 506, the method 500 may proceed with converting, by the equipment controller 600, dynamic data associated with the selected sets from a time domain to a frequency domain to obtain sets of frequency data. In some embodiments of the disclosure, the conversion can be carried out using FFT using a baseline file. In certain embodiments of the disclosure, a set with the smallest variation of magnitude of phase current can be selected as the baseline file for the FFT.

In block 508, the method 500 may proceed with averaging, by the equipment controller 600, the frequency data in the selected sets to obtain the baseline data to be used in further comparisons with incoming data to detect anomalies and failures of the electrical rotating machine 110.

In block 510, the method 500 may include computing, by the equipment controller 600, a standard deviation of the frequency data for at least one fault frequency associated with the electrical rotating machine 110.

In block 512, the method 500 may proceed with determining, by the equipment controller and based on the standard deviation, the threshold associated with the fault frequency and the bucket of operational conditions. The threshold and baseline data can be further used to generate an alarm concerning a health condition of electrical rotating machine 110 as described in FIG. 3. For example, if incoming data is greater than baseline data plus a threshold at the fault frequency, then the alarm is generated.

In some embodiments of the disclosure, the threshold can be using the following formula: threshold=constant*standard deviation. The constant can be determined based on a percentage of expected false positives. In some embodiments, constant=0.84 for 20% of false positives, constant=1.28 for 10% of false positives, and constant=1.64 for 5% of false positives.

In some embodiments of the disclosure, the threshold can be further adjusted based on noise floor of the frequency data. In certain embodiments, a histogram function can be used to determine the most popular magnitude in frequency data. The most popular magnitude can be used as the noise floor. In some embodiments of the disclosure, if baseline+threshold is smaller than noise floor+20 dB, then baseline+threshold is set to noise floor+20 dB.

Figure 6:
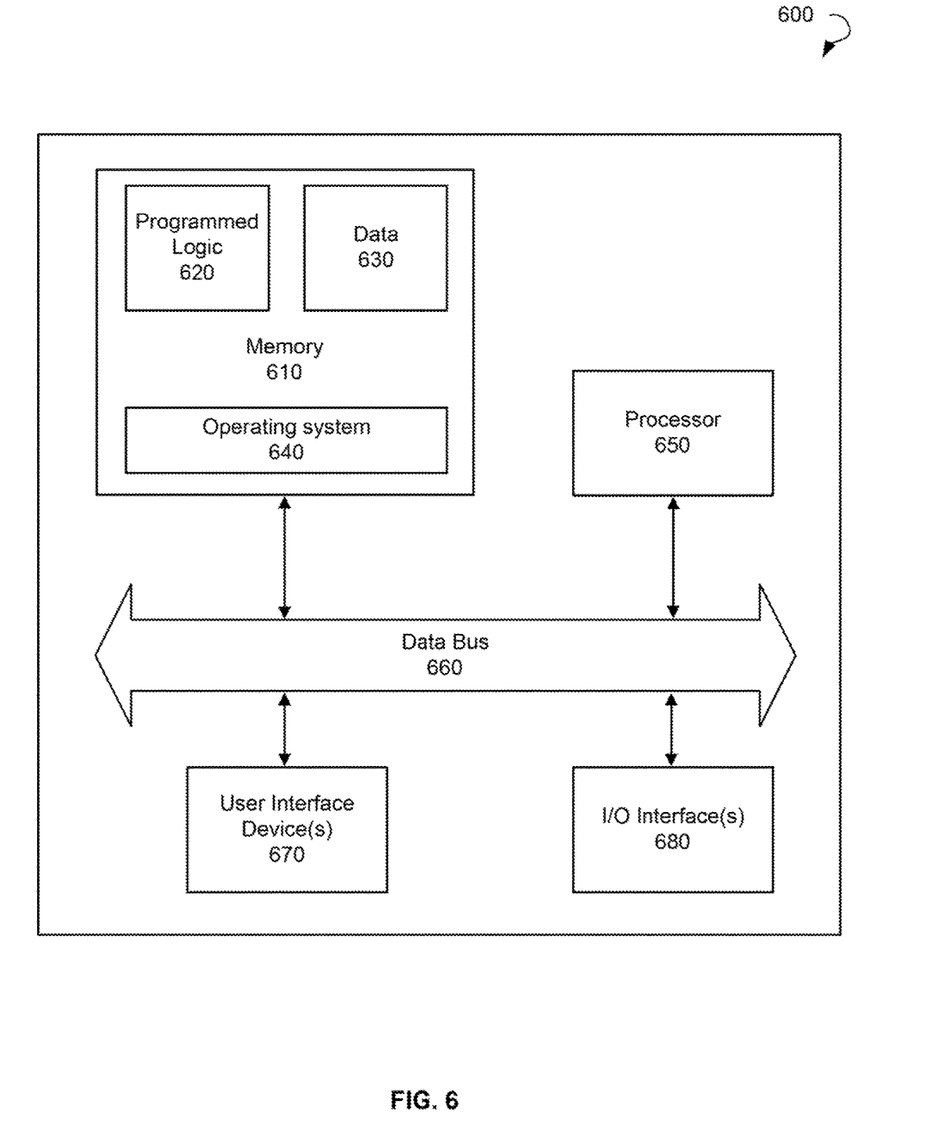
FIG. 6 is a block diagram illustrating an example controller for controlling operation of a combustor, in accordance with an embodiment of the disclosure.

FIG. 6 depicts a block diagram illustrating an example controller 600, in accordance with an embodiment of the disclosure. More specifically, the elements of the controller 600 may be used to automatically collect and analyze operational data associated with the system 100 while the system 100 is running. The controller 600 may include a memory 610 that stores programmed logic 620 (e.g., software) and may store data 630, such as operational data associated with the system 100, the set of constants, and the like. The memory 610 also may include an operating system 640.

A processor 650 may utilize the operating system 640 to execute the programmed logic 620, and in doing so, may also utilize the data 630. A data bus 660 may provide communication between the memory 610 and the processor 650. Users may interface with the controller 600 via at least one user interface device 670, such as a keyboard, mouse, control panel, or any other device capable of communicating data to and from the controller 600. The controller 600 may be in communication with the system 100 while operating via an input/output (I/O) interface 680. Additionally, it should be appreciated that other external devices or multiple other systems or IEDs may be in communication with the controller 600 via the I/O interface 680. In some embodiments of the disclosure, the controller 600 may be located remotely with respect to the system 100; however, in other embodiments of the disclosure, it may be co-located or even integrated with the system 100. Further, the controller 600 and the programmed logic 620 implemented thereby may include software, hardware, firmware, or any combination thereof. It should also be appreciated that multiple controllers 600 may be used, whereby different features described herein may be executed on one or more different controllers 600.

References are made to block diagrams of systems, methods, apparatuses, and computer program products, according to example embodiments of the disclosure. It will be understood that at least some of the blocks of the block diagrams, and combinations of blocks in the block diagrams, may be implemented at least partially by computer program instructions. These computer program instructions may be loaded onto a general purpose computer, special purpose computer, special purpose hardware-based computer, or other programmable data processing apparatus to produce a machine, such that the instructions which execute on the computer or other programmable data processing apparatus create means for implementing the functionality of at least some of the blocks of the block diagrams, or combinations of blocks in the block diagrams discussed.

These computer program instructions may also be stored in a computer-readable memory that can direct a computer or other programmable data processing apparatus to function in a particular manner, such that the instructions stored in the computer-readable memory produce an article of manufacture including instruction means that implement the function specified in the block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the block or blocks.

One or more components of the systems and one or more elements of the methods described herein may be implemented through an application program running on an operating system of a computer. They also may be practiced with other computer system configurations, including handheld devices, multiprocessor systems, microprocessor based or programmable consumer electronics, mini-computers, mainframe computers, and the like.

Application programs that are components of the systems and methods described herein may include routines, programs, components, data structures, and so forth that implement certain abstract data types and perform certain tasks or actions. In a distributed computing environment, the application program (in whole or in part) may be located in local memory or in other storage. In addition, or alternatively, the application program (in whole or in part) may be located in remote memory or in storage to allow for circumstances where tasks are performed by remote processing devices linked through a communications network.

Many modifications and other embodiments of the example descriptions set forth herein to which these descriptions pertain will come to mind having the benefit of the teachings presented in the foregoing descriptions and the associated drawings. Thus, it will be appreciated that the disclosure may be embodied in many forms and should not be limited to the example embodiments described above.

Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A system comprising:
an electrical rotating machine;
a data acquisition device configured to detect and provide at least electrical data associated with the electrical rotating machine; and
an equipment controller communicatively coupled to the data acquisition device, the equipment controller being configured to:
in a learning mode: ascertain initial information associated with the electrical rotating machine;
assign a plurality of operational conditions associated with the electrical rotating machine to a plurality of buckets, wherein at least one bucket of the plurality of buckets is associated with at least one load window selected from a plurality of load windows;
record the electrical data to obtain a pre-defined number of sets of learning data;
determine, based at least on the initial information and the learning data, that the electrical rotating machine is in a healthy condition; and
based on a determination that the electrical rotating machine is in the healthy condition:
obtain, based on the learning data, baseline data associated with the at least one bucket;
generate, based on the baseline data, a threshold associated with the at least one bucket and at least one fault frequency associated with the electrical rotating machine; and
generate, based on the threshold and the baseline data, at least one alarm concerning a state of the electrical rotating machine, the electrical rotating machine running within operational conditions associated with the at least one bucket, wherein the equipment controller configured to generate the threshold is further configured to:
compute variations for the sets of the learning data associated with the at least one bucket;
select sets with variation less than a pre-determined value;
convert the learning data associated with the selected sets from a time domain to a frequency domain to obtain sets of frequency data;
average the sets of frequency data to obtain the baseline data;
compute a standard deviation of the frequency data for at least one fault frequency; and
determine, based on the standard deviation, the threshold associated with the at least one fault frequency and the at least one bucket, wherein the equipment controller configured to generate the threshold is further configured to compute the threshold by multiplying a standard deviation by a predetermined constant value, the predetermined constant value being selected based on an expected false positive error.

2. The system of claim 1, wherein the equipment controller, while in a monitoring mode, is further configured to:
continue recording the electrical data to obtain incoming data;
determine a current bucket associated with the incoming data;
determine that the baseline data and the threshold are present for the current bucket; and
based on a determination that the baseline data and the threshold are present:
determine that incoming data exceed the baseline data by more than the threshold for the at least one fault frequency; and
based on a determination that the incoming data exceed the baseline data by more than the threshold for the at least one fault frequency, issue an alarm concerning at least one event of the electrical rotating machine.

3. The system of claim 1, wherein the equipment controller configured to determine that the electrical rotating machine is in the healthy condition is further configured to:
obtain, based on the learning data, static data including at least vibration data and temperature signal;
determine that the static data are within a pre-defined range;
based on a determination that the static data are within a pre-defined range, conclude that the electrical rotating machine is in a healthy condition; and
based on a determination that the static data are not within a pre-defined range, issue a recommendation regarding an inspection of the electrical rotating machine.

4. The system of claim 1, wherein the equipment controller configured to determine that the electrical rotating machine is in the healthy condition is further configured to:
compute load conditions for the pre-defined number of sets of learning data;
determine, based on the load conditions, a bucket containing most frequently occurring load conditions;
evaluate, based on the learning data within the bucket, operational data of the electrical rotating machine, the operational data including one of a speed, a torque, or an efficiency;
determine that the operational data are within a pre-defined range; and
based on a determination that the operational data are not within the pre-defined range, issue a recommendation regarding an inspection of the electrical rotating machine.

5. The system of claim 4, wherein the equipment controller configured to determine that the electrical rotating machine is in the healthy condition is further configured to:
compute variations for the sets of the learning data;
select a set with variation less than a pre-determined value;
assign the learning data of the selected set as baseline data;
convert the baseline data and the learning data associated with the bucket from a time domain to a frequency domain;
determine, based on the baseline data, a first frequency signature for the at least one fault frequency;
determine, based on the learning data associated with the bucket, a second frequency signature for the at least one fault frequency; and determine that the second frequency signature is higher than the first frequency signature by a pre-determined value;

based on a determination that the second frequency signature is lower than the first frequency signature by the pre-determined value, conclude that the electrical rotating machine is in the healthy condition; and based on a determination that the second frequency signature is higher than the first frequency signature by the pre-determined value, issue a recommendation regarding an inspection of the electrical rotating machine.

6. The system of claim 1, wherein the equipment controller configured to obtain the baseline data is further configured to:

compute variations for the sets of the learning data associated with the at least one bucket;

select a set with the smallest variation; and assign the selected set as the baseline data.

7. The system of claim 1, wherein after generating the threshold the equipment controller is further configured to:

determine a noise floor based on the baseline data; and adjust the threshold based on the noise floor.

8. The system of claim 1, wherein the initial information includes at least one of name plate details, maintenance intervals, a maintenance history, a previous fault history, operational environment details, and a description of load conditions.

9. A method for electrical signature analysis, the method comprising:

providing, by a data acquisition device communicatively coupled to an electrical rotating machine, at least electrical data associated with the electrical rotating machine;

ascertaining, by an equipment controller communicatively coupled to the data acquisition device, initial information associated with the electrical rotating machine;

assigning, by an equipment controller, a plurality of operational conditions associated with the electrical rotating machine to a plurality of buckets, wherein at least one bucket of the plurality of buckets is associated with at least one load window selected from a plurality of load windows;

recording, by the equipment controller, the electrical data to obtain a pre-defined number of sets of learning data;

determining, by the equipment controller, based at least on the initial information and the learning data, that the electrical rotating machine is in a healthy condition; and based on a determination that the electrical rotating machine is in the healthy condition:

obtaining, by the equipment controller and based on the learning data, baseline data associated with at the at least one bucket;

generating, by the equipment controller and based on the baseline data, a threshold associated with the at least one bucket and the at least one fault frequency associated with the electrical rotating machine; and generating, based on the threshold and the baseline data, an alarm concerning a state of the electrical rotating machine running within operational conditions associated with the at least one bucket, wherein generating the threshold includes:

computing, by the equipment controller, variations for sets of the learning data associated with the at least one bucket;

selecting, by the equipment controller, sets with variation less than a pre-determined value;

converting, by the equipment controller, the learning data associated with the selected sets from a time domain to a frequency domain to obtain sets of frequency data;

averaging, by the equipment controller, the sets of frequency data to obtain the baseline data;

computing, by the equipment controller, a standard deviation of frequency data at the at least one fault frequency; and determining, by the equipment controller and based on the standard deviation, the threshold associated with the at least one bucket, wherein the threshold is determined by multiplying a standard deviation by a predetermined constant, the predetermined constant being selected based on an expected false positive error.

10. The method of claim 9, further comprising:

recording, by the equipment controller, the electrical data to obtain incoming data;

determining, by the equipment controller, a current bucket associated with the incoming data;

determining, by the equipment controller, that the baseline data and the threshold are present for the current bucket; and based on a determination that the baseline data and the threshold are present:

determining, by the equipment controller, that incoming data exceed the baseline data by more than the threshold at the at least one fault frequency; and based on the determination that that the incoming data exceed the baseline data by more than the threshold for at least one fault frequency, issuing, by the equipment controller, an alarm concerning at least one event of the electrical rotating machine.

11. The method of claim 9, wherein determining that the electrical rotating machine is in the healthy condition includes:

obtaining, by the equipment controller and based on the learning data, static data including at least vibration data and temperature signal;

determining, by the equipment controller, that the static data are within a pre-defined range;

based on a determination that the static data are within a pre-defined range, establishing that the electrical rotating machine is in the healthy condition; and based on the determination that the static data are not within the pre-defined range, issuing, by the equipment controller, a recommendation regarding an inspection of the electrical rotating machine.

12. The method of claim 9, wherein the determining that the electrical rotating machine is in the healthy condition includes:

computing, by the equipment controller, load conditions for the pre-defined number of sets of learning data;

determining, by the equipment controller and based on the load conditions, a bucket containing most frequently occurring load conditions;

evaluating, by the equipment controller and based on the learning data within the bucket, operational data of the electrical rotating machine, the operational data including one of a speed, a torque, or an efficiency;

determining, by the equipment controller, that the operational data are within a pre-defined range; and based on a determination that the operational data are not within a pre-defined range, issuing, by the equipment controller, a recommendation regarding an inspection of the electrical rotating machine.

13. The method of claim 12, wherein the determining that the electrical rotating machine is in the healthy condition, further comprises:
computing, by the equipment controller, variations for the sets of the learning data;
selecting, by the equipment controller, a set with the variation less than a pre-determined value;
assigning, by the equipment controller, the learning data of the selected set as the baseline data;
converting, by the equipment controller, the baseline data and the learning data associated with the at least one bucket from a time domain to a frequency domain;
determining, by the equipment controller and based on the baseline data, a first frequency signature for the at least one fault frequency;
determining, by the equipment controller and based on the learning data associated with the load window, a second frequency signature for the at least one fault frequency; and
determining, by the equipment controller, that the second frequency signature is higher than the first frequency signature by a pre-determined value;
based on the determination that the second frequency signature is not higher than the first frequency signature by the pre-determined value, establishing that the electrical rotating machine is in the healthy condition; and
based on the determination that the second frequency signature is higher than the first frequency signature by the pre-determined value, issuing, by the equipment controller, a recommendation regarding an inspection of the electrical rotating machine.

14. The method of claim 9, wherein obtaining the baseline data includes:
computing, by the equipment controller, variations for sets of the learning data associated with the at least one bucket;
selecting, by the equipment controller, a set with the smallest variation; and
assigning, by the equipment controller, the selected set as the baseline data.

15. The method of claim 9, further comprising, after generating the threshold:
determining, by the equipment controller, a noise floor based on the baseline data; and
adjusting, by the equipment controller, the threshold based on the noise floor.

16. A system for electrical signature analysis, the system comprising:
an electrical rotating machine;
a data acquisition device configured to detect and provide at least electrical data associated with the electrical rotating machine, wherein the electrical data includes a current data and a voltage data; and
an equipment controller communicatively coupled to the data acquisition device, the equipment controller configured to:
in a learning mode:
ascertain initial information associated with the electrical rotating machine;
assign a plurality of operational conditions associated with the electrical rotating machine to buckets, wherein at least one bucket of the plurality of buckets is associated with at least one load window selected from a plurality of load windows;
record the electrical data to obtain a pre-defined number of sets of learning data;
determine, based at least on the initial information and the learning data, that the electrical rotating machine is in healthy condition; and
based on the determination that the electrical rotating machine is in the healthy condition:
obtain, based on the learning data, baseline data associated with at least one bucket; and
generate, based on the baseline data and a predetermined constant, a threshold associated with the at least one bucket and with the at least one fault frequency associated with the electrical rotating machine, the predetermined constant being selected based on an expected false positive error;
determine a noise floor based on the baseline data; and
adjust the threshold based on the noise floor;
in a monitoring mode:
record the electrical data to obtain incoming data;
determine a current bucket associated with the incoming data;
determine that the baseline data and the threshold are present for the current bucket; and
based on the determination that the baseline data and the threshold are present:
determine that incoming data exceed the baseline data by more than the threshold at the at least one fault frequency; and
based on the determination that the incoming data exceed the baseline data by more than the threshold for the at least one fault frequency, issue an alarm concerning at least one event associated with the electrical rotating machine; and
if the baseline data and the threshold are not present:
record the incoming data to the learning data associated with the current bucket; and
switch to the learning mode.

* * * * *